United States Patent [19]

Stoops

[11] Patent Number: 4,873,646

[45] Date of Patent: Oct. 10, 1989

[54] DIGITAL CORRECTION OF LINEAR SYSTEM DISTORTION

[75] Inventor: John F. Stoops, Portland, Oreg.

[73] Assignee: Tektronix, Inc., Beaverton, Oreg.

[21] Appl. No.: 140,703

[22] Filed: Jan. 4, 1988

Related U.S. Application Data

[63] Continuation-in-part of Ser. No. 755,022, Jul. 15, 1985, abandoned.

[51] Int. Cl.$^4$ .................. G06F 15/353; G01R 13/20
[52] U.S. Cl. .................................. 364/487; 364/572; 364/574; 364/724.14; 315/76
[58] Field of Search ................ 364/487, 572, 574, 723, 364/724, 807; 375/11–14; 324/121 R; 315/76

[56] References Cited

U.S. PATENT DOCUMENTS

| | | | |
|---|---|---|---|
| 3,633,105 | 4/1972 | Lender et al. | 364/724 X |
| 3,949,206 | 4/1976 | Edwards et al. | 375/11 X |
| 4,093,989 | 6/1978 | Flink et al. | 364/572 |
| 4,095,225 | 6/1978 | Erikmats | 364/572 X |
| 4,101,964 | 7/1978 | Betts | 364/724 |
| 4,476,432 | 10/1984 | Olson | 324/121 R |
| 4,616,175 | 10/1986 | Hanmura | 324/121 R |
| 4,633,425 | 12/1986 | Senderowicz | 364/724 |
| 4,691,293 | 9/1987 | Conboy | 364/724 |
| 4,695,969 | 9/1987 | Sollenberger | 364/724 |
| 4,729,113 | 3/1988 | Boutigny | 364/807 |

Primary Examiner—Felix D. Gruber
Attorney, Agent, or Firm—Daniel J. Bedell; Peter J. Meza

[57] ABSTRACT

An M-element waveform data sequence representative of an analog input signal during a period of interest is produced by first amplifying the input signal with a linear amplifier and periodically digitizing the amplifier output signal to produce a first data sequence having $M+N-1$ elements. The first $N-1$ elements of the first data sequence represent magnitudes of the amplifier output signal preceding the period of interest, and the remaining M elements of the first data sequence represent magnitudes of the amplifier output signal during the period of interest. The first data sequence is applied as input to a digital filter which produces an output second data sequence wherein each element of the second data sequence corresponds to an element of the first data sequence and is a linear combination of its corresponding first data sequence element and $N-1$ data preceding data elements of the first data sequence. The impulse response of the filter is adjusted to compensate for signal distortion caused by the amplifier. The desired M-element waveform data sequence is then obtained as the last M elements of the second data sequence.

11 Claims, 4 Drawing Sheets

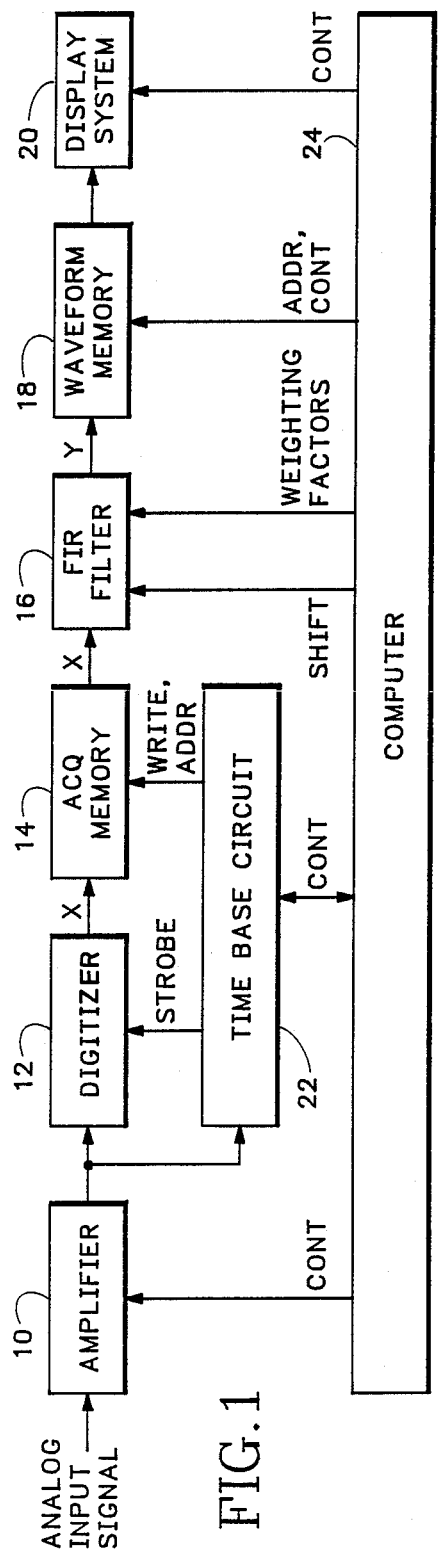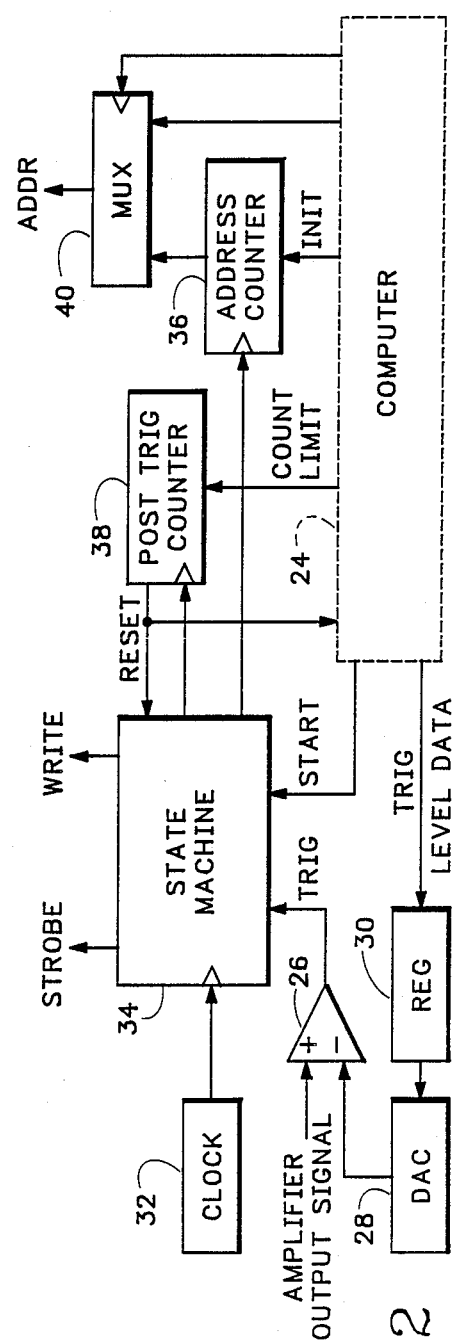

DIGITAL CORRECTION OF LINEAR SYSTEM DISTORTION

CROSS-REFERENCE TO RELATED APPLICATIONS

This is a continuation-in-part of U.S. patent application Ser. No. 755,022, filed July 15, 1985 and now abandoned.

BACKGROUND OF THE INVENTION

The present invention relates in general to digital filters and in particular to a method and apparatus for correcting distortion of signals by analog linear systems.

Digitizing systems, such as digital oscilloscopes, typically use a linear amplifier to amplify (or attenuate) and/or offset an input signal so that the amplifier output signal has peak amplitudes suitably near, but within the full scale input range of a digitizer. This is done so that the input signal can be digitized with full resolution of the digitizer. Unfortunately, due to inherent response characteristics of the amplifier, the output signal produced by an amplifier is a somewhat distorted version of the input signal. For example, When the input signal to an amplifier is a square wave, the resulting "square wave" output signal of the amplifier may be overdamped or underdamped. Thus a waveform data sequence produced by the digitizer in response to an amplifier output signal may not accurately represent a scaled version of the amplifier input signal.

In such digitizing systems, distortion effects of the amplifier can be removed from the waveform data sequence by passing the data sequence through a compensating digital filter such as a finite impulse response (FIR) filter. An FIR filter produces an output data sequence wherein each element is a weighted sum of preceding elements of an input data sequence as represented by the expression:

$$y_i = \sum_{n=1}^{N} f_n x_{i+1-n}$$

where $x_i$ is the $i^{th}$ element of the filter's input data sequence, the first element of the input data sequence being $x_0$, $y_i$ is the $i^{th}$ element of the filter's output data sequence, $f_n$ is a weighting factor, and N is the "length" of the filter (i.e., the maximum number of terms in the sum forming each element $y_i$. The transfer function of such an FIR filter is adjusted by changing the weighting factors $f_1, f_2 \ldots f_N$. A desired transfer function can often be approximated more accurately by increasing the number N of terms in the expression.

While an appropriately adjusted FIR filter can correct a data sequence output of a digitizer to compensate for signal distortion in an analog input signal to the digitizer generated by a linear amplifier, the FIR filter itself introduces distortion. Since elements $x_i$ of the filter's input data sequence for $i<0$ are not provided to the filter, the filter must compute elements $y_i$ for $i<N$ in accordance with the above expression by assuming arbitrary values such as 0 for $x_i$ when $i<0$. Since the assumed arbitrary values may bear no relation to magnitudes of the amplifier input signal, the first N−1 terms of the filter output provide a distorted representation of the input signal.

SUMMARY OF THE INVENTION

In accordance with one aspect of the invention, an M-element waveform data sequence representative of an analog input signal during a period of interest is produced by first amplifying (or attenuating) and/or offsetting the input signal with a linear amplifier to produce an output signal that is suitably within an input range of a digitizer. The amplifier output signal is then periodically digitized to produce a first data sequence having M+N−1 elements. The first N−1 elements of the first data sequence represent magnitudes of the amplifier output signal preceding the period of interest, and the remaining M elements of the first data sequence represent magnitudes of the amplifier output signal during the period of interest. The first data sequence is applied as input to a finite impulse response filter of length N which produces an output second data sequence. Each element of the second data sequence corresponds to an element of the first data sequence and is a linear combination of its corresponding first data sequence element and N−1 preceding data elements of the first data sequence. The transfer function of the filter is adjusted to compensate for signal distortion caused by the amplifier. The desired M-element waveform data sequence is then obtained as the last M elements of the second data sequence.

In accordance with another aspect of the invention, the M-element waveform data sequence is supplied as input to a display system that produces a waveform display in accordance with the waveform data sequence. The waveform display thus represents the time dependent behavior of the analog input signal and is not substantially affected by distortion caused by the amplifier.

In accordance with a further aspect of the invention, in an alternative embodiment thereof, the M-element waveform data sequence is supplied as input to digital-to-analog converter that produces an analog output signal that is an amplified (or attenuated) and/or offset version of the amplifier input signal during a period of interest and which is not substantially affected by inherent signal distortion effects of the amplifier.

It is accordingly an object of the invention to provide a waveform data sequence representative of an analog signal during a period of interest.

It is another object of the invention to provide an output analog signal that is a substantially undistorted yet an amplified, attenuated, and/or offset version of an analog signal during a period of interest.

It is a further object of the invention to provide a waveform display representative of an analog signal during a period of interest.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

BRIEF DESCRIPTION OF THE DRAWING

FIG. 1 is a block diagram of a digital oscilloscope employing the present invention;

FIG. 2 is a block diagram of the trigger, timing and addressing circuit of FIG. 1;

DESCRIPTION OF THE PREFERRED EMBODIMENTS

Figure 3:
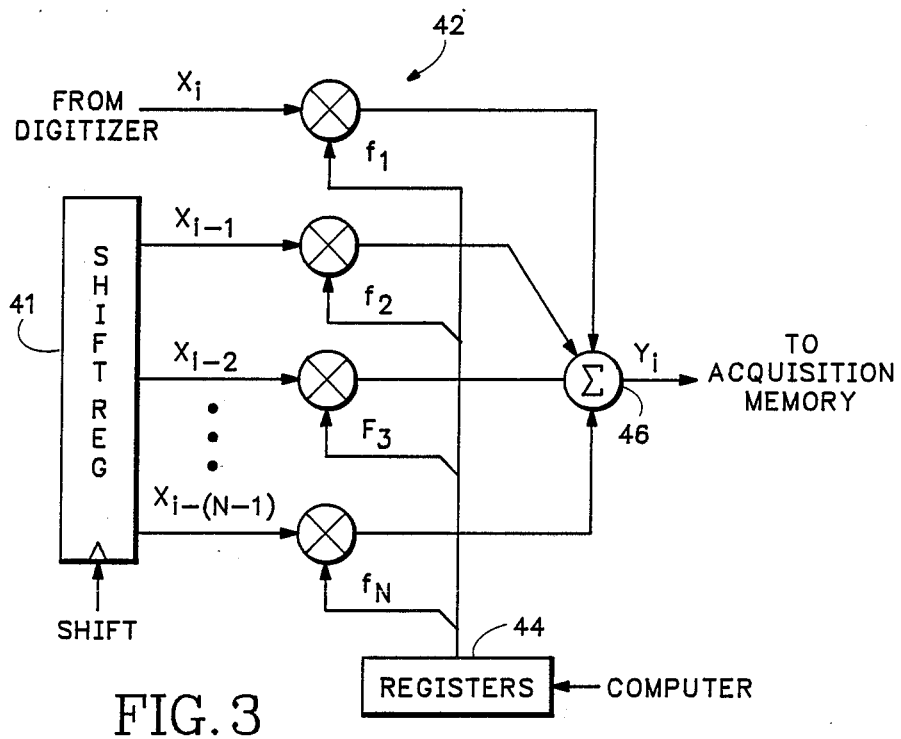
FIG. 3 is a block diagram of the linear, finite impulse response filter of FIG. 1.

With reference to FIG. 1 showing a digital oscilloscope in block diagram form, an analog input signal is offset and amplified by a linear amplifier 10 to produce an analog output signal applied as input to a digitizer 12. Digitizer 12 periodically digitizes the amplifier output signal to produce a first data sequence X for storage in an acquisition memory 14. The first data sequence X is subsequently read out of memory 14 and provided as input to a finite impulse response (FIR) filter 16. In response to the first data sequence X, filter 16 produces an output second data sequence Y wherein each element of second data sequence Y is a linear combination of previously occurring elements of the first data sequence X. Elements of the second data sequence Y are stored as a waveform data sequence in a waveform memory 18. The waveform data sequence may be subsequently read out of memory 18 and supplied to a conventional digital oscilloscope display system 20 which produces a waveform display by plotting magnitudes of successive elements of the waveform data sequence on a cathode ray tube screen.

A time base circuit 22 transmits a sequence of STROBE signals to digitizer 12 which generates a new element of the first data sequence X each time it receives a STROBE signal. Shortly after generating each STROBE signal, the time base circuit 22 transmits a WRITE signal to acquisition memory 14 causing the acquisition memory to store the last produced element of the first data sequence X at an address ADDR also provided by the time base circuit. The time base circuit 22 thereafter increments the acquisition memory address ADDR so that the next element of first sequence X is thereafter stored at a next address in the acquisition memory 14.

A computer 24 provides control signals to time base circuit 22 for controlling the waveform data acquisition process. Computer 24 can also transmit a sequence of addresses to acquisition memory 14 via time base circuit 22 causing acquisition memory 14 to read out a stored first data sequence X to FIR filter 16. As each element of first sequence X is read out of acquisition memory 14, computer 24 transmits a SHIFT signal to FIR filter 16 causing the filter to generate a next element of the second data sequence Y. Computer 24 additionally transmits address and control signals to waveform memory 18 which cause the waveform memory to store elements of the second data sequence produced by FIR filter 16 as a waveform data sequence for controlling the waveform display produced by display system 20. Computer 24 also controls read out of waveform data sequences stored in waveform memory 18 to display system 20 in a conventional manner.

FIG. 2 shows the time base circuit 22 of FIG. 1 in more detailed block diagram form. The output signal of amplifier 10 of FIG. 1 is provided as input to a comparator 26 which produces a trigger signal) (TRIG) when the amplifier output signal exceeds a trigger level signal produced by a digital-to-analog converter (DAC) 28. Trigger level data stored in a register 30 by computer 24 of FIG. 1 provides input to DAC 28. A clock 32 supplies a clocking signal to a state machine 34 that begins sequentially producing the STROBE and WRITE signal outputs of time base circuit 22 after receiving a START control signal from computer 24.

After asserting each WRITE signal, state machine 34 transmits a count incrementing signal to a programmable address counter 36. The count output of address counter 36 provides the ADDR input to acquisition memory 14 of FIG. 1 by way of a multiplexer 40 controlled by computer 24. Prior to data acquisition, computer 24 switches multiplexer 40 so that it passes the output of counter 36 to the acquisition memory and initializes the count in address counter 36.

Prior to initiating data acquisition, computer 24 also stores in a trigger counter 38 a count limit from which counter 38 counts down. After detecting a first occurrence of the TRIG signal output of comparator 26 following initiation of state machine 34 operation by the START signal, state machine 34 transmits a count decrement signal to trigger counter 38 each time it asserts the WRITE signal. When counter 38 counts down to 0, it transmits a RESET signal to state machine 34, which causes the state machine to reset to an initial state in which it awaits another START signal from computer 24. The RESET signal also interrupts computer 24 to tell it that a waveform data sequence has been acquired and stored in acquisition memory 14 of FIG. 1.

Thereafter, to develop a waveform data sequence in waveform memory 18 of FIG. 1 from which a waveform display may be produced, computer 24 switches multiplexer 40 so that it passes addresses supplied by computer 24 to the acquisition memory 14 of FIG. 1 and begins to sequentially address elements of the stored data sequence X in acquisition memory 14 by way of multiplexer 40 so that the acquired first data sequence X is sequentially read out of the acquisition memory and supplied to FIR filter 16 of FIG. 1. The computer 24 also sends a series of SHIFT signals to FIR filter 16 so that the filter produces elements of the second data sequence Y as the first data sequence X is read out of acquisition memory 14 and transmits a sequence of address and control signals to waveform memory 18 of FIG. 1 and so that waveform memory 18 stores selected elements of second data sequence Y as a waveform data sequence for controlling a waveform display.

FIG. 3 shows the linear FIR filter 16 of FIG. 1 in more detailed block diagram form. The current ($i^{th}$) data element $x_i$ of the first data sequence X output of digitizer 12 of FIG. 1 is supplied as input to a shift register 41 and as input to one of N multipliers 42. The shift register 41 shifts in the current data element read out of acquisition memory 14 of FIG. 1 each time computer 24 of FIG. 1 asserts the SHIFT signal. The shift register 41 stores the last N−1 data elements ($x_{i-1}$ through $x_{i-N-1}$) of the first data sequence X and supplies each stored data element as an input to a separate one of the multipliers 42. Registers 44, storing data provided by computer 24 of FIG. 1, supply a separate weighting factor ($f_1$ through $f_N$) as input to each multiplier 42. The outputs of multipliers 42 are summed by a summer 46 to produce the current element $y_i$ of second data sequence Y output of filter 16. Thus the filter 16 produces each element $y_i$ of the second data sequence Y in accordance with the expression:

$$y_i = \sum_{n=1}^{N} f_n x_{i+1-n} \quad [1]$$

where $x_i$ is the $i^{th}$ element of the filter's input data sequence X, $y_i$ is the $i^{th}$ element of the filter's output data sequence Y, $f_n$ is a weighting factor, and N is the "length" of the filter (the maximum number of elements of input data sequence X in the sum forming each element $y_i$).

The transfer function of this FIR filter is adjusted to compensate for distortion of the input signal by amplifier 10 of FIG. 1 by appropriately setting the weighting factors $f_1, f_2 \ldots f_N$ stored in registers 44. Bunks et al describe a method for selecting weighting factors for an FIR filter so that it compensates the digitized output of a linear, time-invariant system (such as amplifier 10 of FIG. 1) to provide a desired overall transfer function. See "Minimax Time-Domain Deconvolution For Transversal Filter Equalizers", ICASSP 80 Proceedings, vol. 3, IEEE International Conference on Acoustics, Speech, and Signal Processing, pp. 943–949, published April 1980 and incorporated herein by reference. See also "Application of the Optimal Control Theory to the Deconvolution Problem", by G. Thomas, ICASSP 80 Proceedings, vol. 3, IEEE International Conference on Acoustics, Speech, and Signal Processing, pp. 947–949, published April 1980 and incorporated herein by reference.

As described by Bunks et al, the overall impulse response g(t) of a linear system cascaded with an equalizing filter is determined by convolution of the impulse response h(t) of the linear system and the impulse response f(t) of the filter according to the expression:

$$g(t) = \int_0^t f(x)h(t-x)dx \quad [2]$$

For an FIR filter of length N, its impulse response is $$f(t) = \sum_{n=1}^{N} f_n \delta(t - nT) \quad [3]$$

where T is the period between digitizer samples and $\delta( )$ is the unit impulse function. Substituting equation [3] into equation [2] we have, $$g(t) = \sum_{n=1}^{N} f_n h(t - nT) \quad [4]$$

Thus to find the appropriate values of $f_n$ to produce a desired overall impulse response g(t), one must first measure the impulse response h(t) of the linear system (e.g. amplifier 10) and then solve equation [4] for $f_1, f_2, \ldots f_N$. Methods for measuring the impulse response of a linear system are well-known, but for a given h(t) it is usually not possible to choose weighting factors $f_n$ so as to satisfy equation [4] for all values of t. However Bunks et al describe an iterative method for optimizing values of $f_n$ for a given value of N wherein the maximum value of an error function $$r(t) = g(t) - \sum_{n=1}^{N} f_n h(t - nT). \quad [5]$$

is minimized for all values of t within the domain of definition of g(t). Other iterative search methods for minimizing an expression such as equation [5] with respect to sets of independent variables such as $f_n$ are well known to those skilled in the art.

While an FIR filter 16 adjusted to minimize the maximum value of r(t) for all values of t can substantially correct a data sequence output of digitizer 12 so as to compensate for signal distortion in an analog input signal to the digitizer caused by linear amplifier 10, the FIR filter 16 itself introduces distortion. An FIR filter such as that described by equation [1] must assume that all elements $x_i$ for values of $i<0$ have 0 or some arbitrarily selected value because the filter does not have access to data elements representing magnitudes of the analog signal at times preceding the first element $x_0$ of its input data sequence. For example when the FIR filter assumes that elements $x_i$ for $i<0$ have 0 magnitude, values of the first N elements $y_i$ of the output data sequence of the filter are computed as follows (given, for example that N=5):

$$y_0 = f_1 x_0 + 0 + 0 + 0 + 0$$
$$y_1 = f_1 x_1 + f_2 x_0 + 0 + 0 + 0$$
$$y_2 = f_1 x_2 + f_2 x_1 + f_3 x_0 + 0 + 0$$
$$y_3 = f_1 x_3 + f_2 x_2 + f_3 x_1 + f_4 x_0 + 0$$
$$y_4 = f_1 x_4 + f_2 x_3 + f_3 x_2 + f_4 x_1 + f_5 x_0$$

As can be seen, the first N−1 elements $y_i$ of the output data sequence have terms that are arbitrarily set to 0. Typically, however, an analog input signal to digitizer does not have a value of 0 at all times prior to the time associated with the first element $x_0$ of first sequence X. Therefore, the FIR filter 16 properly compensates for distortion of amplifier 10 only after it achieves "steady state" operation, i.e., after it has received an processed the first N elements of its input data sequence X. Prior to producing the Nth element of its output second data sequence, the FIR filter 16 exhibits a "transient" response to its input data sequence X wherein the first N−1 terms of the output data sequence $y_i$ that it produces provide a distorted representation of the amplifier input signal due to faulty assumptions as to the magnitude of the input signal prior to the time associated with element $x_0$.

In accordance with the invention, to produce a waveform data sequence for storage in waveform memory 18 having M elements representative of the input signal, digitizer 12 is operated to transmit a first data sequence X having M+N−1 elements to FIR filter 16, by way of acquisition memory 14, so that FIR filter 16 produces in response a second data sequence Y also having M+N−1 elements. The desired M-element waveform data sequence to be stored in waveform memory 18 is then selected as the last M consecutive elements of the second data sequence Y produced by the digital filter. In other words, computer 24 causes waveform memory 18 to store only the last M elements of sequence Y, the first N−1 elements are ignored.

For example, suppose that the waveform data sequence to be stored in waveform memory 18 is to have M=256 data elements, the first 128 of which are to precede a triggering event in the amplifier 10 input signal and the remaining 128 of which are to follow the trigger event. Suppose also that N=8. Then with reference to FIG. 2, address counter 36 is provided with a full range address count of (M+N−1)=263 so that acquisition memory 14 of FIG. 1 stores 263 elements of first data sequence X produced by digitizer 12 at 263 consecutive addresses. When counter 36 reaches a count of 263 it resets to 0 so that the next element produced by the digitizer is stored in the acquisition memory 14 at address 0, overwriting the element previously stored at that address. Computer 24 sets trigger counter 38 to count down from 128, so that when counter 38 counts down to 0 so as to terminate data acquisition, 128 of the 263 elements subsequently stored in memory 14 represent magnitudes of the amplifier output signal occurring after the trigger event and the remaining 128+7=135 elements represent magnitudes of the amplifier output signal occurring before the triggering event. This 263 element first data sequence X is then read out to FIR filter 16, and filter 16 produces in response a 263 second data sequence Y. However, computer 24 causes waveform memory 18 to store only the last M =256 elements of second data sequence Y as the representative M-element waveform data sequence.

Figure 4A:
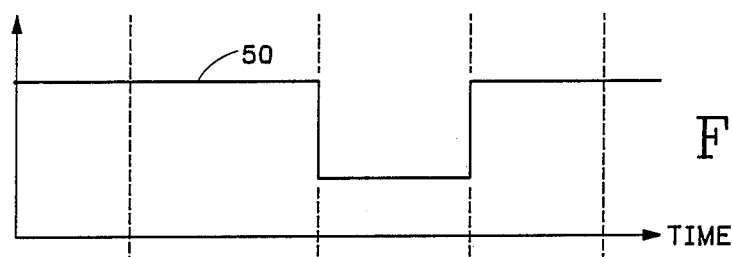
FIG. 4A is a timing diagram of an analog input signal to amplifier 10 of FIG. 1.
Figure 4B:
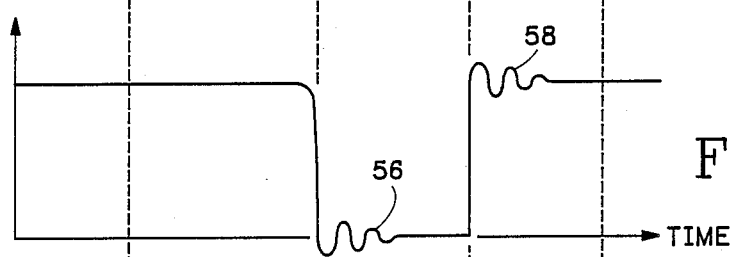
FIG. 4B is a timing diagram of an output signal produced by amplifier 10 in response to the input signal diagrammed in FIG. 4A.
Figure 4C:
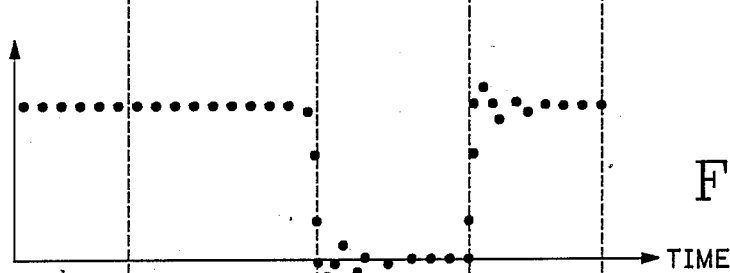
FIG. 4C is a plot of magnitudes of a digital data sequence produced by the digitizer of FIG. 1 in response to the amplifier output signal diagrammed in FIG. 4B.

Operation of the oscilloscope of FIG. 1 is further illustrated with reference to FIGS. 4A-4D. FIG. 4A is a timing diagram of a portion of a square wave analog input signal 50 to amplifier 10 of FIG. 1 including a falling edge at time T1 and a rising edge at time T2. We wish to acquire a waveform data sequence that represents the square wave signal between ties T0 and T3. FIG. 4B illustrates the output of amplifier 10 in response to the square wave signal of FIG. 4A. Note that after times T1 and T2, the output signal exhibits distortions 56 and 58 introduced by amplifier 10. FIG. 4C is a plot of magnitudes of successive elements of the first data sequence X produced by digitizer 12 of FIG. 1 in response to the amplifier output signal diagrammed in FIG. 4B. Note that distortions 56 and 58 of FIG. 4B are reflected in the first data sequence X of FIG. 4C. The triggering event in the analog input signal of FIG. 4A is suitably the rising edge of the signal at time T2. In such case, the count limit set in counter 38 of FIG. 38 is set so that the first N−1 data elements represent input signal magnitudes prior to time T0.

Figure 4D:
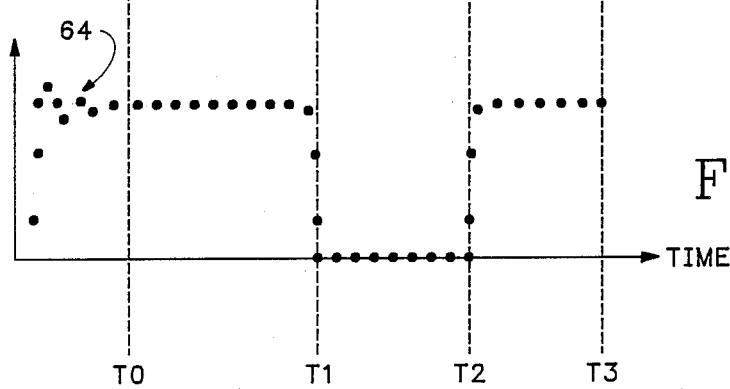
FIG. 4D is a plot of magnitudes of a digital data sequence produced by the linear finite impulse response filter of FIG. 1 in response to the data sequence plotted in FIG. 4C.

FIG. 4D is a plot of the second data sequence Y produced by the FIR filter 16 in response to the first data sequence X plotted in FIG. 4C. Note that FIR filter 16 has eliminated from the second data sequence Y the distortions 56 and 58 that appear in the first data sequence X shown in FIG. 4C. Although distortion 64 due to the transient response of FIR filter 16 is apparent in the first N−1 elements of the second data sequence Y of FIG. 4D, that distortion does not extend into the data elements representing magnitudes of the analog input signal during the period of interest T0-T3. These data elements representing magnitudes of the input signal between times T0 and T3 are stored in waveform memory 18 of FIG. 1 for subsequent use in controlling a waveform display produced by display system 20.

Thus the oscilloscope of FIG. 1 provides an M-element waveform data sequence representative of an analog input signal during a period of interest. As discussed hereinabove, the waveform data sequence is produced by first amplifying and/or offsetting the input signal with a linear amplifier to produce an amplifier output signal that is suitably within a full scale input range of a digitizer. The amplifier output signal is then periodically digitized to produce a first data sequence having M+N−1 elements. The first N−1 elements of the first data sequence represent magnitudes of the amplifier output signal preceding the period of interest, and the remaining M-elements of the first data sequence represent magnitudes of the amplifier output signal during the period of interest. The first data sequence is applied as input to a finite impulse response filter of length N which produces an output second data sequence wherein each element of the second data sequence corresponds to an element of the first data sequence and is a linear combination of its corresponding first data sequence element and N−1 data preceding data elements of the first data sequence. The transfer function of the filter is adjusted to compensate for signal distortion caused by the amplifier. The desired M-element waveform data sequence is then obtained as the last M elements of the second data sequence.

Figure 5:
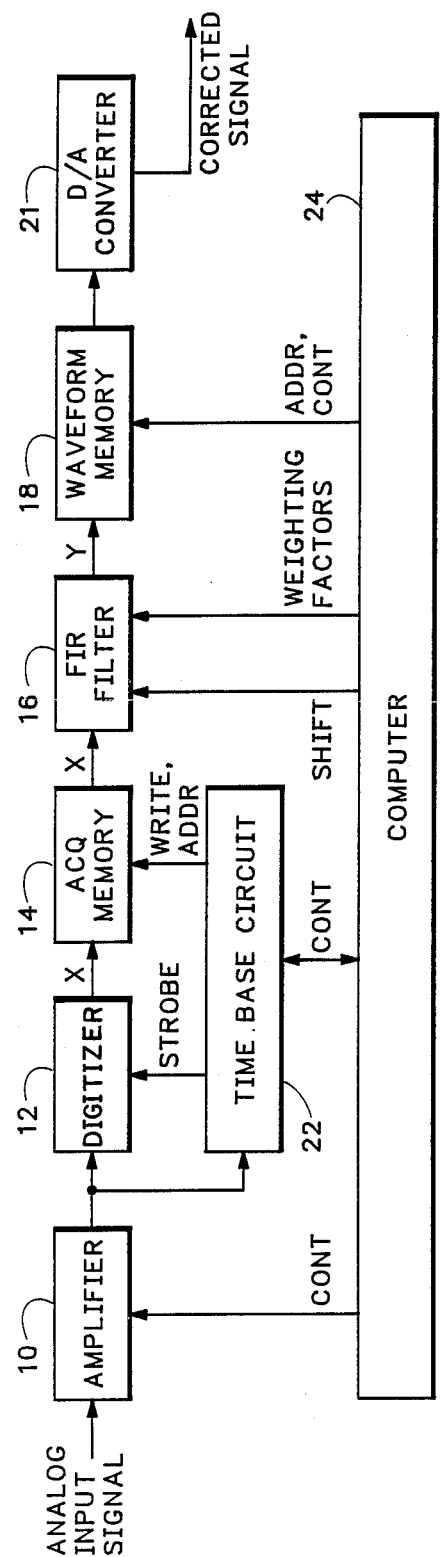
FIG. 5 is a block diagram of a circuit employing an alternative embodiment of the invention to generate an output analog signal that is a substantially distortion free amplified and/or offset version of a portion of an analog input signal.

FIG. 5 shows an alternative embodiment of the invention which is similar to the preferred embodiment of the invention as illustrated in FIG. 1 except that display system 20 is replaced with a digital-to-analog (D/A) converter 21 that converts the waveform data sequence read out of waveform memory 18 to an analog "corrected" signal. The corrected signal is a substantially distortion free amplified, attenuated and/or offset version of the analog input signal to amplifier 10 during a period of interest. As in the preferred embodiment, the transfer function of FIR filter 16 is suitably adjusted to compensate for distortion caused by amplifier 10, N−1 elements of input data sequence X to filter 16 are acquired immediately before the period of interest, and the first N−1 elements of the output data sequence Y of filter 16 are not included in the waveform data sequence stored in waveform memory 18. The corrected signal output of this circuit may, for example, be utilized to control the vertical position of an electron beam as it sweeps across the screen of a cathode ray tube thereby to create a waveform display in a manner similar to that produced by a conventional analog oscilloscope.

While preferred and alternative embodiments of the present invention have been shown and described, it will be apparent to those skilled in the art that many changes and modifications may be made without departing from the invention in its broader aspects. For example, the function of FIR filter 16 of FIGS. 1 and 5 could be carried out by computer 24 reading data sequence X out of acquisition memory 14, computing elements of sequence Y in accordance with expression [1] above, and storing selected elements of sequence Y in waveform memory 18. The appended claims are therefore intended to cover all such changes and modifications as fall within the true spirit and scope of the invention.

I claim:

1. An oscilloscope for displaying a waveform representing a sequence of magnitudes related to a sequence of magnitudes of an analog input signal during a period of interest in accordance with a predetermined response characteristic, the oscilloscope comprising:

a linear system for producing an analog output signal in response to the analog input signal, the analog output and input signals differing but being related in accordance with a first response characteristic of the linear system;

digitizer means for periodically digitizing the output signal to produce a first data sequence having at least $M+N-1$ elements, where in at east $N-1$ elements of the first data sequence represent magnitudes of the analog output signal preceeding the period of interest, and wherein M elements of the first data sequence represent magnitudes of the analog output signal during the period of interest, M and N being integers greater than 1;

a digital filter for producing an output second data sequence wherein each element of the second data sequence corresponds to an element of the first data sequence, the digital filter having a second response characteristic such that each element of the second data sequence corresponding to an element of the first data sequence representing a magnitude of the analog output signal during the period of interest is a linear combination of its corresponding first data sequence element and $N-1$ preceeding data elements of the first data sequence;

means for generating a third data sequence consisting of the elements of the second data sequence corresponding to the M elements of the first data sequence representing magnitudes of the analog output signal during the period of interest; and display means for displaying a waveform representing the elements of said third data sequence.

2. The oscilloscope as recited in claim 1 wherein the linear system comprises an amplifier.

3. The oscilloscope as recited in claim 1 further comprising means for receiving said third data sequence and for displaying said waveform in accordance with said third data sequence.

4. The oscilloscope as recited in claim 3 wherein the second response characteristic is set in accordance with a combination of the first response characteristic and the predetermined response characteristic such that the sequence of magnitudes represented by said waveform is related to a sequence of magnitudes of an analog input signal during a period of interest in accordance with the predetermined response characteristic.

5. The oscilloscope as recited in claim 1 wherein the filter comprises a finite impulse response digital filter of length N.

6. A method for displaying a waveform representing a sequence of magnitudes related to a sequence of magnitudes of an analog unput signal during a period of interest in accordance with a predetermined response characteristic, the method comprising the steps of:

producing an analog output signal in response to the analog input signal, the analog output and input signals differing but being related in accordance with a first response characteristic;

periodically digitizing the output signal to produce a first data sequence having at least $M+N-1$ elements, wherein at least $N-1$ elements of the first data sequence represent magnitudes of the analog output signal preceeding the period of interest, and wherein M elements of the first data sequence represent magnitudes of the analog output signal during the period of interest, M and N being integers greater than 1;

producing a second data sequence in response to the first data sequence wherein each element of the second data sequence corresponds to an element of the first data sequence, wherein each element of the second data sequence corresponding to an element of the first data sequence representing a magnitude of the analog output signal during the period of interest is a linear combination of its corresponding first data sequence element and $N-1$ preceeding data elements of the first data sequence;

generating a third data sequence consisting of each element of the second data sequence corresponding to an element of the first data sequence representing magnitudes of the analog output signal during the period of interest; and displaying said waveform on a display device in accordance with said third data sequence.

7. The method as recited in claim 6 further comprising the step of setting the second response characteristic in accordance with a combination of the first response characteristic and the predetermined response characteristic such that the sequence of magnitudes represented by said waveform is related to a sequence of magnitude of an analog input signal during a period of interest in accordance with the predetermined response characteristic.

8. An oscilloscope for producing and displaying an analog corrected signal related to an analog input response characteristic, the apparatus comprising:

a linear system for producing an analog output signal in response to the analog input signal, the analog output and input signals differing but being related in accordance with a first response characteristic of the linear system:

digitizer means for periodically digitizing the output signal to produce a first data sequence having at least $M+N-1$ elements, wherein at least $N-1$ elements of the first data sequence represent magnitudes of the analog output signal preceeding the period of interest, and wherein M elements of the first data sequence represent magnitudes of the analog output signal during the period of interest, M and N being integers greater than 1;

a digital filter for producing an output second data sequence wherein each element of the second data sequence corresponds to an element of the first data sequence, the digital filter having a second response characteristic such that each element of the second data sequence corresponding to an element of the first data sequence representing a magnitude of the analog output signal during the period of interest is a linear combination of its corresponding first data sequence element and $N-1$ preceeding data elements of the first data sequence;

means for generating a third data sequence consisting of the elements of the second data sequence corresponding to the M elements of the first data sequence representing magnitudes of the analog output signal during the period of interest;

means for receiving said third data sequence and for generating said analog corrected signal in accordance with said third data sequence and display means for displaying a waveform representing the analog corrected signal.

9. The oscilloscope as recited in claim 8 wherein the linear system comprises an amplifier.

10. The oscilloscope as recited in claim 8 wherein the second response characteristic is set in accordance with a combination of the first response characteristic and the predetermined response characteristic such analog corrected signal is related to the analog input signal during a period of interest in accordance with the predetermined response characteristic.

11. The oscilloscope as recited in claim 8 wherein the filter comprises a finite impulse response digital filter of length N.

* * * * *